US006639800B1

United States Patent
Eyman et al.

(10) Patent No.: US 6,639,800 B1
(45) Date of Patent: Oct. 28, 2003

(54) HEAT SINK SUBASSEMBLY

(75) Inventors: Lewis Michael Eyman, Pflugerville, TX (US); Roger Q. Paulsel, Cedar Creek, TX (US); Stanley O. Sharp, Austin, TX (US); James W. Delso, Bastrop, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/135,502

(22) Filed: Apr. 30, 2002

(51) Int. Cl.[7] ................................................. H05K 7/20
(52) U.S. Cl. ...................... 361/704; 361/710; 361/719; 361/818; 174/35 R; 257/719; 257/726; 165/80.2; 165/185
(58) Field of Search .............................. 165/80.2, 80.3, 165/121–122, 185; 174/16.3, 35 R; 257/706–707, 712–713, 718–717, 722, 726–727; 361/704, 697, 707, 709–710, 719–721, 816, 818

(56) References Cited

U.S. PATENT DOCUMENTS

| 5,357,404 | A | 10/1994 | Bright et al. |
| 5,566,052 | A | 10/1996 | Hughes |
| 6,205,026 | B1 * | 3/2001 | Wong et al. ................. 361/704 |
| 6,219,239 | B1 | 4/2001 | Melberg et al. |
| 6,269,863 | B1 | 8/2001 | Wyler |
| 6,477,050 | B1 * | 11/2002 | Herring et al. ............. 361/704 |

* cited by examiner

Primary Examiner—Gregory Thompson
(74) Attorney, Agent, or Firm—Robert C. Kowert; Meyertons, Hood, Kivlin & Kowert & Goetzel, P.C.

(57) ABSTRACT

A heat sink subassembly may include a retainer comprising several attachment points, a heat sink coupled to the retainer, and a force-generating device. The heat sink includes several fins, one of which is shorter than the other fins. The force-generating device is coupled to at least one of the attachment points and to the first fin. The force-generating device is configured to exert a force that keeps the heat sink securely coupled to the retainer when the force-generating device is coupled to the attachment points.

57 Claims, 6 Drawing Sheets

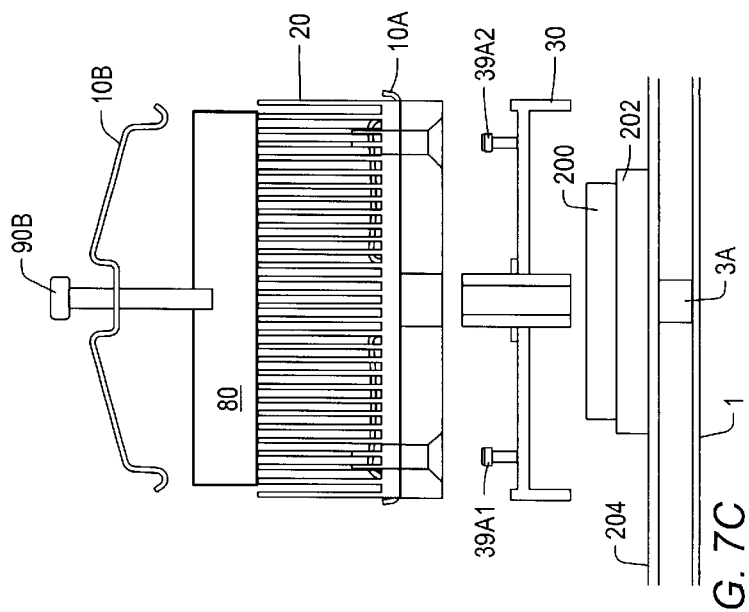
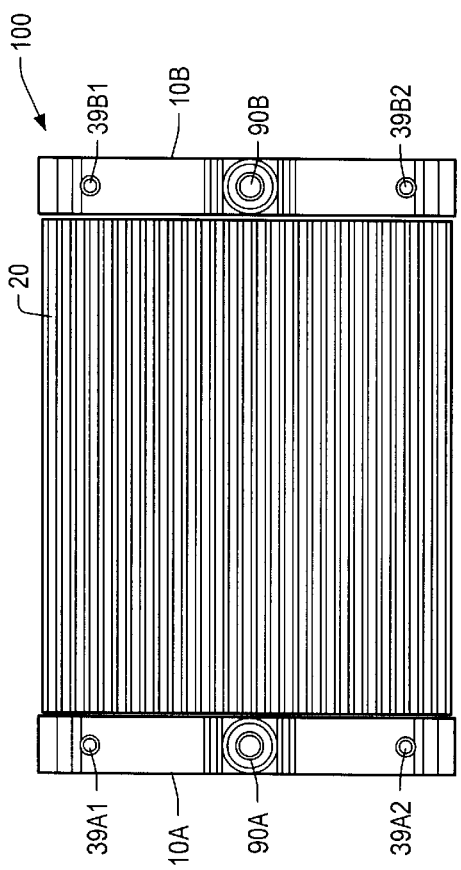
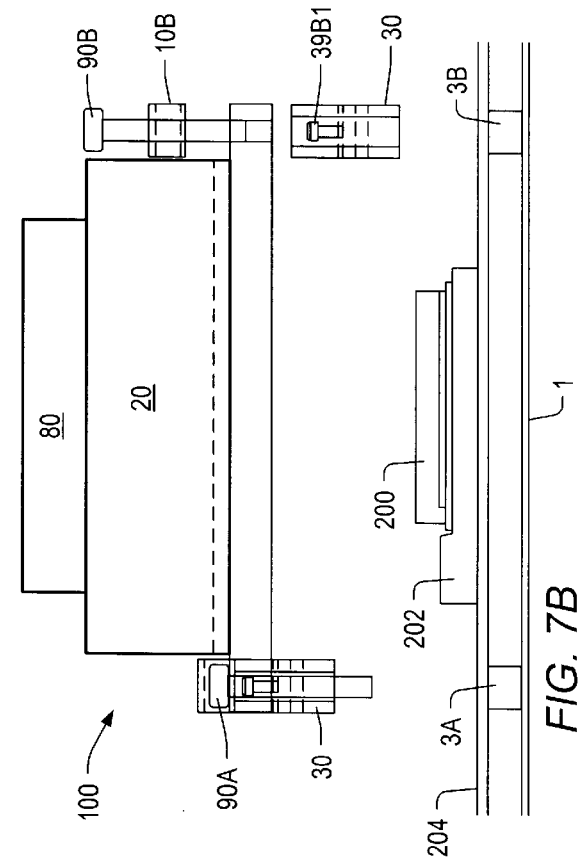

HEAT SINK SUBASSEMBLY

BACKGROUND OF THE INVENTION

1. Field of the Invention

This invention relates to computer systems and, more particularly, to heat sinks used to dissipate heat in computer systems.

2. Description of the Related Art

Electronic enclosures may contain many different electronic devices that are designed to operate within certain temperature ranges. However, when operating, each electronic device may generate heat. If enough heat is generated within the enclosure to cause any of the enclosed electronic devices to operate outside of their operational temperature range, problems may occur. For example, in some cases, increased temperature may cause a system to malfunction or behave erroneously. Sometimes, increased heat may even damage the electronic devices or components within the enclosure.

In order to reduce heat-related problems, many electronic enclosures include cooling devices. One simple example of a cooling device is a passive heat sink that radiates heat from a device into the surrounding air. A passive heat sink is simply a piece of metal attached to a component in such a way that the component transfers heat to the heat sink. By increasing the surface area from which heat can be radiated, heat sinks increase the amount of heat that can be transferred from a component to the surrounding air. Some heat sinks have fins, which further increase the surface area and allow even more heat to be radiated away. In some systems, passive heat sinks may be all that is needed to ensure proper cooling. For example, convection will cause heated air to rise higher than cooler air, so in some cases, hotter air will naturally be circulated away from the heat-generating component while cooler air is constantly being circulated towards the component. In other systems though, factors such as the size of the enclosure or the orientation of the device within the enclosure may limit the beneficial effects of convection. In such situations, other cooling devices may be needed to prevent heat-related problems.

One problem that arises in systems that simply radiate heat is that the heat may accumulate inside an area in the enclosure. For example, convection may no longer assist in cooling if all of the air in an area becomes equally heated. One situation where this might arise is if a heat-generating component is located near the top of an enclosure. The top component may quickly lose any benefits of convection due to the accumulation of heated air in the top of the enclosure. Another situation where this might arise occurs when many devices are mounted in close proximity in an enclosure. Each device's ability to radiate heat away from itself may be limited if the surrounding air has already been heated by the other components.

In order to alleviate problems that arise when heat accumulates, many systems incorporate devices that can move already-heated air away from an area and draw less-heated air into the area. Air movers such as fans and blowers (e.g., centrifugal fans) are popular cooling devices because they are capable of moving heated air away from and/or cooler air towards areas where heat-related problems may arise. By regularly moving heated air away from or cooler air over a component, the component's ability to radiate heat is better maintained. For example, air movers may move either warmer or cooler air to another section of an enclosure, move heated air from inside an enclosure to the outside of the enclosure, or move cooler air from outside an enclosure to the inside of the enclosure. Often, air movers are mounted onto passive heat sinks to create active heat sinks.

As processing speeds increase and die sizes decrease, electronic devices are decreasing in size and generating increasing amounts of heat. Consequentially, heat sinks are required to dissipate increasing amounts of heat away from smaller areas. One way to improve heat sink performance is to increase the size and/or mass of the heat sink. This in turn often increases the weight of the heat sink. Increased heat sink weight may increase the risk that the heat sink may decouple from and/or damage the device it is attached to if the chassis containing the heat sink is dropped or bumped. In order to reduce this risk, the heat sink may be coupled to the device it is cooling by a force that is a function of the weight of the heat sink. Often, this force is supplied by spring clips.

Heat sink attachment may be further complicated by the form factor of the device to be cooled. For example, the micro PGA form factor requires a surface-mount socket due to routing constraints. With a surface-mount socket, the semiconductor package cannot be allowed to move in an axis parallel to the package pins. As a result, forces much larger than have previously been necessary for heat sink attachment are now required for adequate heat sink attachment. Additionally, the printed circuit board to which the socket is mounted cannot be significantly deformed by the heat sink attachment force or by any force imparted to the heat sink assembly during a mechanical shock. Furthermore, during the assembly process, the forces applied to the surface mount socket need to be applied uniformly to prevent solder damage (e.g., solder crazing).

Currently, heat sinks are attached by fastening two plastic retainers to the printed circuit board, threading a spring clip into a heat sink and fan assembly, placing the heat sink and fan assembly with the spring clip onto the plastic retainers, aligning the heat sink and fan assembly over the processor, snapping an end of the spring clip into one plastic retainer, and using downward force to snap the other end of the spring clip into the remaining plastic retainer. A force equal to the spring force of the spring clip may need to be supplied in order to initially couple the heat sink to the device it is to cool. This force is usually supplied by assembly line workers. As heat sink weights increase, increasing amounts of force are required to attach the heat sinks. This leads to increased strain on workers.

SUMMARY

Various embodiments of an improved heat sink subassembly are disclosed. In one embodiment, a heat sink subassembly may include a retainer comprising several attachment points, a heat sink coupled to the retainer, and a force-generating device. The heat sink includes several fins, one of which is shorter than the others. The force-generating device is coupled to at least one of the attachment points and to the shorter fin. The force-generating device is configured to exert a force that keeps the heat sink securely coupled to the retainer when the force-generating device is coupled to the attachment points. In some embodiments, the heat sink subassembly may include an electromagnetic shield coupled to the retainer (e.g., by a retaining ridge extending along an inside surface of the retainer) that may be inserted into and removed from the retainer without decoupling the heat sink from the retainer.

In another embodiment, a computer system may include a printed circuit board, an integrated circuit coupled to the printed circuit board, and a heat sink subassembly coupled to the printed circuit board. The heat sink subassembly may include a retainer, a heat sink that includes several fins, one of which is shorter than the others, and is coupled to the retainer, and a force-generating device coupled to the shorter fin. The force-generating device is configured to exert a force on the heat sink. The force keeps the heat sink securely coupled to the integrated circuit.

In other embodiments, a computer system may include a printed circuit board that includes several holes, an integrated circuit, and a heat sink subassembly. The heat sink subassembly may include a retainer coupled to the printed circuit board by no more than two fasteners, where each of the fasteners extends through a respective one of the holes in the printed circuit board, a heat sink coupled to the retainer, and one or more force-generating devices coupled to the heat sink and the retainer. The one or more force-generating devices exert a force on the heat sink that securely couples the heat sink to the integrated circuit. An installation force required to couple the heat sink subassembly to the printed circuit board and to cause the one or more force-generating devices to exert the force on the heat sink is less than the force exerted on the heat sink by the one or more force-generating devices.

A method of assembling a computer system may involve attaching a force-generating device to a retainer to form a heat sink subassembly in which a heat sink is interposed between a portion of the force-generating device and a portion of the retainer and where the attaching causes the force-generating device to hold the heat sink in the retainer; placing the heat sink subassembly over an integrated circuit coupled to a printed circuit board; and coupling the heat sink subassembly to the printed circuit board by exerting an installation force, where the installation force is less than a force exerted by the force-generating device on the heat sink as a result of said coupling.

BRIEF DESCRIPTION OF THE DRAWINGS

A better understanding of the present invention can be obtained when the following detailed description is considered in conjunction with the following drawings, in which:

FIGS. 7A–7C show another embodiment of a computer system.

Figure 1A:
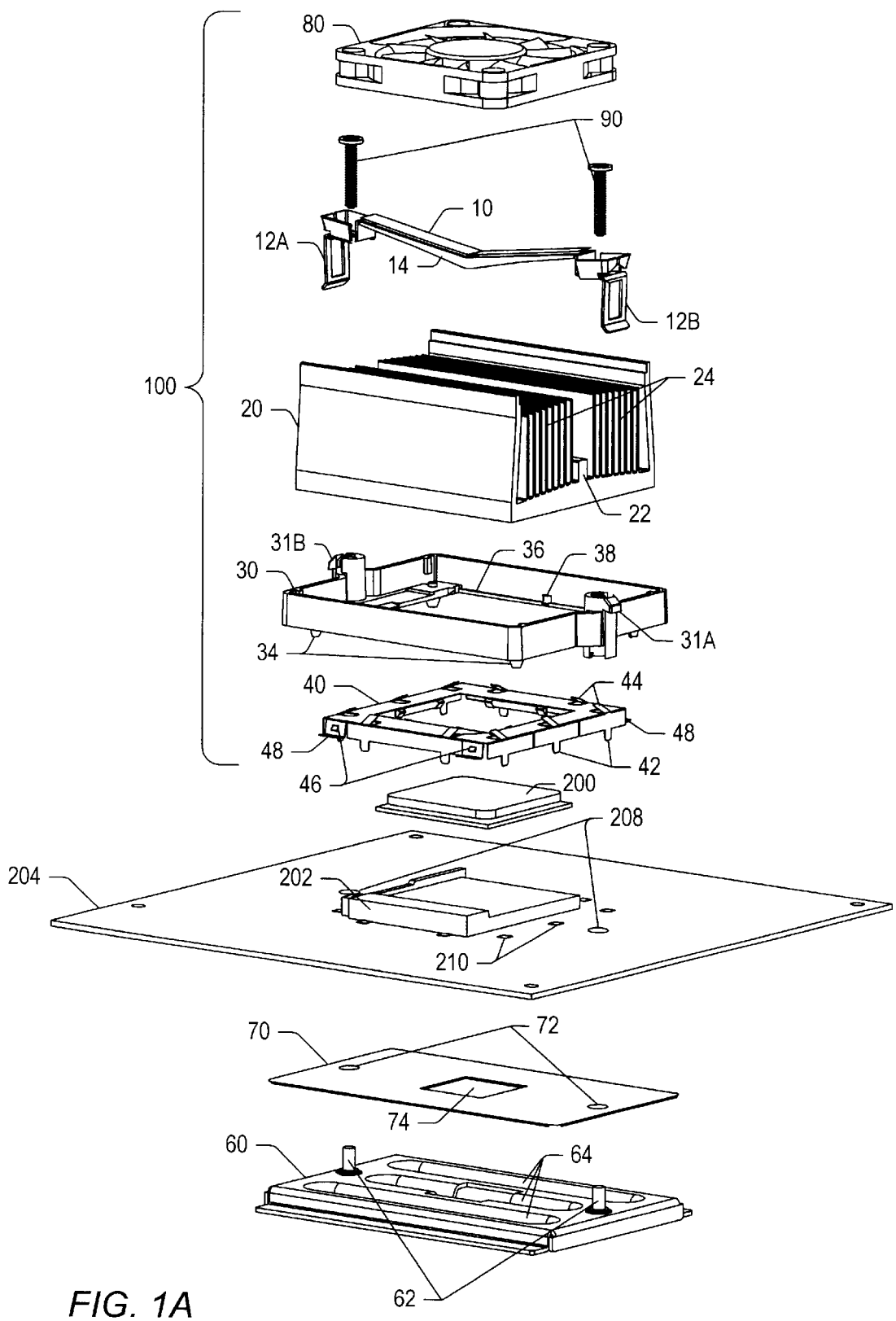
FIGS. 1A and 1B illustrate one embodiment of a computer system that includes a heat sink subassembly.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims:

DETAILED DESCRIPTION OF EMBODIMENTS

FIG. 1A shows an exploded perspective view of one embodiment of a computer system that includes a heat sink subassembly 100, an integrated circuit 200, a printed circuit board 204, an insulator 70, and a stiffening plate 60. As shown, heat sink subassembly may include a fan 80, a spring clip 10, two screws 90, a heat sink 20, a retainer 30, and electromagnetic shielding 40. In alternative embodiments, several of the components (e.g., screws 90, fan 80, and/or electromagnetic shielding 40) shown in FIG. 1A may not be included in a subassembly sold by a heat sink manufacturer. Note that as described herein, individual components labeled by the same reference number followed by a distinct alphabetic identifier (e.g., tangs 12A and 12B) may be collectively referred to by that number alone (e.g., tangs 12). Also, note that when descriptions refer to a directional orientation of a component (e.g., above or below another component, or having an upper or lower surface), the directional orientation is being used to describe the relative portrayal of the component in the accompanying figures and is not meant to define an absolute orientation of that component.

Fan 80 may be attached to heat sink 20 by one or more fasteners. For example, in some embodiments, fan 80 may be attached by screws. The ends of the screws may thread into threaded receptacles molded or drilled into an upper portion of heat sink 20 in some embodiments. In other embodiments, the ends of the screws may simply be lodged in between neighboring fins 24.

When heat sink subassembly 100 is installed in the computer system, spring clip 10 is configured to exert a force on heat sink 20, keeping heat sink 20 in contact with integrated circuit 200. Each end of spring clip 10 may include a hole through which a fastener (e.g., a screw) 90 may be threaded. Spring clip 10 includes two tangs 12, which may be configured to be coupled to projections in retainer 30, as will be described in more detail below. Spring clip 10 may also include two flanges or sides 14 (only one side 14 is shown in FIG. 1A). In some embodiments, spring clip 10 may be formed from a sheet of material, and each side 14 may be formed by folding a portion of the spring clip material. Note that alternative embodiments, heat sink subassembly 100 may include one or more force-generating devices other than spring clip. 10.

Heat sink 20 includes several fins 24. Additionally, heat sink 20 may include a fin 22 that is significantly shorter and wider than fins 24. Spring clip 10 may contact heat sink 20 along the length of fin 22. Varying the height of fin 22 may change an amount of deflection experienced by the spring clip 10 when the heat sink subassembly is coupled to the printed circuit board 204. By increasing the height of fin 22, spring clip 10's deflection may be increased, increasing the amount of force exerted by spring clip 10. Similarly, decreasing the height of fin 22 may decrease the deflection of spring clip 10, decreasing the amount of force exerted by spring clip 10. The height of fin 22 may be adjusted by the heat sink manufacturer (e.g., by adjusting a mold used to make the heat sink) or by a user of the heat sink (e.g., by adding or removing material at the top of fin 22).

In one embodiment, heat sink 20 may include preapplied thermal compound (not shown) to increase the heat transfer between the heat sink 20 and the integrated circuit 200. For example, in one embodiment, heat sink 20 may be shipped with a thin layer of thermal compound covered by a removable sheet of plastic or paper. An assembler may remove the removable sheet to expose the thermal compound before attaching the heat sink subassembly to the printed circuit board.

Retainer 30 may be configured to limit the lateral movement of the heat sink 20. Retainer 30 may also be configured to provide a base upon which other components such as heat sink 20 and spring clip 10 may be attached so that heat sink subassembly 100 forms an integrated subassembly. When heat sink subassembly 100 is attached to printed circuit board 204, retainer 30 may be configured to maintain a spaced distance between the heat sink 20 and the printed circuit board. In this embodiment, the retainer 30 includes several feet 34 that help maintain this spaced distance. Retainer 30 may be molded or pieced together such that it forms a single piece of the subassembly. In one embodiment, retainer 30 may be made from plastic.

In some embodiments, screws 90 may be inserted through spring clip 10 into crush ribs (not shown) within retainer 30 that are configured to hold screws 90 securely in place during shipping and assembly. When screws 90 are threaded through printed circuit board 204 and/or stiffening plate 60 during assembly, the crush ribs may be.destroyed.

In order to form an integrated heat sink subassembly 100 (e.g., for easier shipping and/or attachment to printed circuit board 204), spring clip 10 and retainer 30 may be configured to be securely attached to each other. Heat sink 20 may fit between retainer 30 and spring clip 10 so that it is held in place as part of the integrated subassembly 100. In the illustrated embodiment, each end of spring clip 10 includes a tang 12 that has a cut-out portion through which a projection 31 extending outward from retainer 30 may extend. In some embodiments, tangs 12 may be flexible such that each tang 12 can be snapped onto a respective projection 31. Once the spring clip 10 has been attached to the retainer, spring clip 10 may be somewhat deflected and/or in close proximity to heat sink 20. Accordingly, spring clip 10 may exert a force on heat sink 10 (or otherwise restrict movement of the heat sink 10), keeping the heat sink 10 coupled to retainer 30 and forming an integrated'subassembly.

Note that in the illustrated embodiment, the cut-out portions of the tangs 12 are longer than is necessary for projections 31. By having longer cut-out portions, one end of the spring clip may be pushed downwards without causing the other end of the spring clip to pull upwards. During assembly, a screw 90 may be inserted into one end of the spring clip 10, through retainer 30, through printed circuit board 204, and into a receptacle 62 before. As the screw is tightened, the tang 12A at that end of the spring clip may move downward relative to the projection 31A that extends through the tang. Accordingly, movement of the tang 12A as a result of the screw being tightened may not result in movement of the retainer 30. This may prevent unequal forces from being applied to integrated circuit 200 during assembly.

Electromagnetic shielding 40 may be included in some embodiments in order to prevent electromagnetic emissions generated by integrated circuit 200 from interfering with other electronic devices. Electromagnetic shielding 40 may be constructed from an electrically conductive material.

Electromagnetic shielding may be attached inside retainer 30 so that it is part of an integrated heat sink subassembly in some embodiments. For example, several projections 46 on the outer sides of electromagnetic shielding 40 may be configured to be snapped onto an inner ridge 36 of retainer 30. Projections 48 extending out horizontally from the sides of electromagnetic shielding may be used to restrict the placement of the electromagnetic shielding 40 within the retainer 30. For example, the projections 48 may ensure that downward projections 42 are not too high to be brought into contact with ground contacts 210. In some embodiments, the electromagnetic shielding may be inserted into and removed from the heat sink assembly without removing any other components (e.g., spring clip 10 and/or heat sink 20) from the heat sink subassembly 100. Projections 38 on the inner sides of retainer 30 may be used to align the electromagnetic shielding 40 within retainer 30.

In this embodiment, electromagnetic shielding 40 includes several downward projections 42 that are configured to be electrically coupled to ground contacts 210 on printed circuit board 204. Ground contacts 210 may be provide on all sides of socket 202 in some embodiments. A downward projection may be provided on electromagnetic shielding 40 for each ground contact 210. Because ground contacts 210 and/or downward projections 42 may have slightly differing heights, each downward projection 42 may be slightly flexible. This may allow all of the downward projections 42 to be coupled to their respective ground contacts 210, despite height variations.

Electromagnetic shielding 40 also includes several upward projections 44 that are configured to be electrically coupled to heat sink 20. Like the downward projections 42, the upward projections may be flexible so that, despite having different lengths and/or angles, each upward projection may contact heat sink 20. By electrically coupling ground contacts 210 to heat sink 20, electromagnetic shielding 40 may effectively create a Faraday cage or shield around integrated circuit 200.

An integrated circuit 200 may be installed in a socket 202 coupled to a printed circuit board 204. Heat sink subassembly 100 is configured to attached to a printed circuit board 204 so that the base of heat sink 20 contacts an upper portion (e.g., a backside in flip-chip configurations) of the integrated circuit 200. In many embodiments, thermal compound may be placed between integrated circuit 200 and heat sink 20.

In some embodiments, heat sink subassembly 100 may be directly coupled to printed circuit board 204. However, in many embodiments, the force exerted by spring clip 10 may potentially deform or damage printed circuit board 204 if the heat sink subassembly is directly coupled to the printed circuit board. If the printed circuit board is deformed, the socket 202 and/or the integrated circuit 200 may in turn be damaged. In order to reduce this risk, heat sink subassembly 100 may be coupled to a stiffening plate 60 that is used to decrease the likelihood of the printed circuit board deforming. Stiffening plate 60 may be manufactured from materials that are less likely to deform under stress than printed circuit board 204.

In many embodiments, the stiffening plate may be constructed from an electrically conductive material (e.g., a metal). An insulator 70 may be placed between the stiffening plate 60 and the underside of the printed circuit board 204 so that any electrical connections on the underside of the printed circuit board are not shorted or damaged by the stiffening plate 60.

In some embodiments, stiffening plate 60 may be a relatively flat sheet of material. However, in some embodiments, the form of stiffening plate 60 may be selected to further decrease the possibility of the stiffening plate deforming. In the illustrated embodiment, stiffening plate 60 includes several hollow ribs 64. Ribs 64 may increase the strength of the stiffening plate 60, making it less likely that the stiffening plate will deform due to stress.

Figure 4:
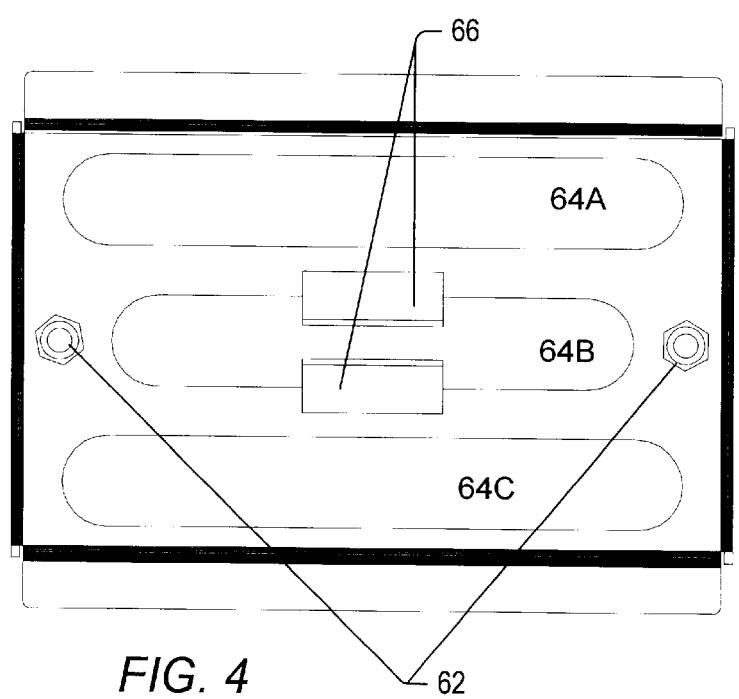
FIG. 4 shows one embodiment of a stiffening plate that may be used in one embodiment of a computer system.

Often, components such as capacitors are attached to the underside of the section of the printed circuit board on which the integrated circuit 200 is attached (e.g., such capacitors may reduce electrical noise generated by integrated circuit 200). In order to avoid contacting or otherwise interfering with such components, insulator 70 and/or stiffening plate 60 may each include one or more cut-out portions. As shown, insulator 70 includes cut-out portion 74. Details of the cut-out portions that may be included in one embodiment of stiffening plate 60 are shown in FIG. 4.

Stiffening plate 60 may include several receptacles 62 (e.g., such as PEM nuts developed and sold by Penn Engineering & Manufacturing Corp.) that extend through holes 72 in insulator 70 and/or through holes 208 in the printed circuit board 204. These receptacles 62 (i.e., fasteners) may also extend into receiving portions of retainer 30. Coupling the heat sink subassembly 100 to the printed circuit board 204 may involve placing the heat sink subassembly 100 so that retainer 30 fits onto the receptacle 62 in such embodiments. Receptacles 62 may include standoffs that keep stiffening plate 60 and/or insulator 70 at a spaced distance from printed circuit board 204. Note that in some embodiments, other suitable fasteners used to couple the heat sink subassembly 100 to printed circuit board 204 and stiffening plate 60 may be included instead of nuts. In embodiments where retainer 30 fits over the fasteners that extend through the printed circuit board, the retainer-fastener junction may increase the stability of the heat sink subassembly while assembly is being completed.

In other embodiments, insulator 70 and/or stiffening plate 60 may be sold with the printed circuit board 204 and/or integrated circuit 200. In such embodiments, adhesive may be applied to one or more portions of the insulator, the stiffening plate 60, and/or the printed circuit board so that these components may be shipped and/or handled by an assembler as an integrated subassembly. The adhesive may keep the components in contact during shipping and/or assembly.while also allowing an assembler or user to separate the insulator 70, stiffening plate 60, and/or printed circuit board 204 without causing component damage in some embodiments. In one embodiment, a removable sheet of paper or plastic may be applied over a layer of adhesive on an upper surface of the insulator and/or the stiffening plate 60. An assembler may remove the removable sheet to expose the adhesive, allowing the insulator and/or stiffening plate 60 to be affixed to the underside of the printed circuit board. Using adhesive to temporarily affix the insulator and/or stiffening plate 60 to the printed circuit board may make it easier to attach heat sink subassembly to printed circuit board 204 in some embodiments (e.g., the insulator and stiffening plate may not need to be held in place while screws 90 are being used to attach the heat sink subassembly to the printed circuit board).

Note that in the illustrated embodiment, heat sink subassembly 100 may be attached to printed circuit board 204 with two fasteners (e.g., screws 90), requiring two holes 208 through printed circuit board 204. Since only two holes are needed, the amount of printed circuit board 204 that may be used for routing may be increased. Similarly, routing complexities that may be caused by routing around additional holes may be decreased.

Figure 1B:
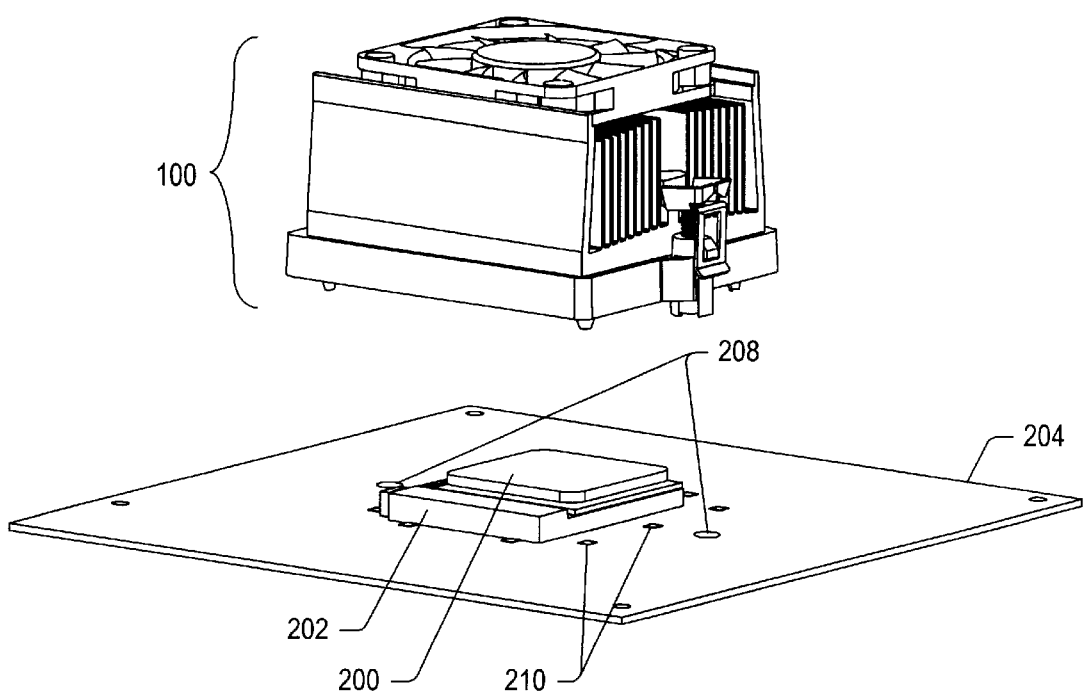

FIG. 1B shows another view of the embodiment of a computer system shown in FIG. 1A. Here, heat sink subassembly 100 is shown as an integrated subassembly that may easily be placed over integrated circuit 200 in socket 202 (in embodiments where a socket-mount is used) and attached.

Being able to ship and handle heat sink subassembly 100 as an integrated component may simplify both packaging and using the heat sink subassembly. For example, there may be a reduced possibility that small parts of the heat sink subassembly will be lost or damaged during handling if these parts are already secured within the integrated subassembly. Since the heat sink subassembly may be preassembled by the manufacturer, less assembler skill may, be required to properly install the heat sink subassembly into a computer system.

Figure 2:
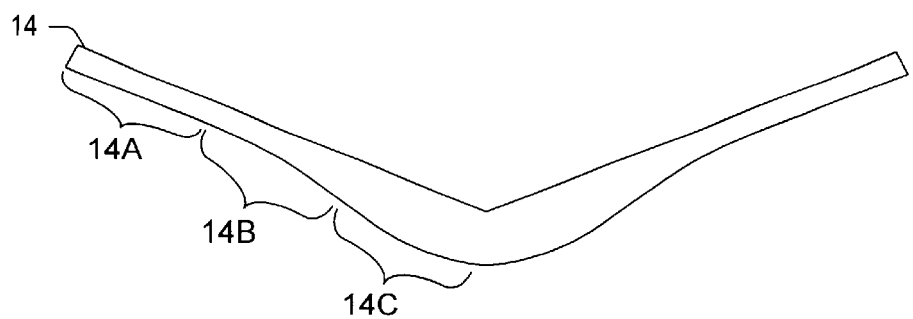
FIG. 2 shows one embodiment of a flange or side of a spring clip that may be included in a heat sink subassembly.

FIG. 2 shows one embodiment of one of the sides 14 of a spring clip 10 that may be included in a heat sink subassembly 100. In this embodiment, the sides 14 of spring clip 10 may be formed so that spring clip 10 is a constant stress spring (or a near-constant stress spring). Here, one side 14 is shown. A top edge of side 14 may be connected to a midsection of the spring clip 10. The bottom edge may not be connected to anything in some embodiments. At a region 14A near each end of the spring, both edges of the side 14 are generally parallel. In a neighboring region 14B, the shape of the bottom edge of the side 14 curves in towards the top edge. In the middlemost region 14C, the shape of the bottom edge curves away from the top edge.

Figure 3:
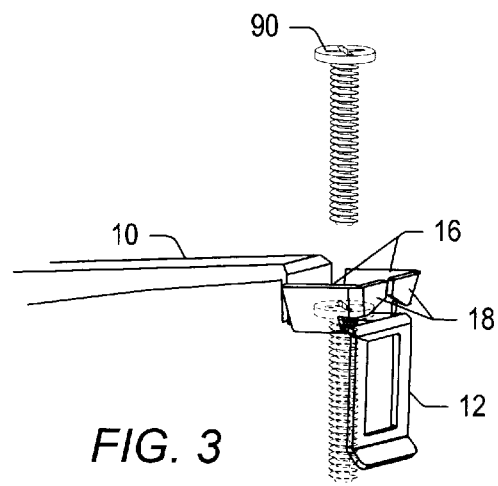
FIG. 3 shows one embodiment of a spring clip that may be included in a heat sink subassembly.

FIG. 3 shows one embodiment of one end of a spring clip 10 that may be included in a heat sink subassembly. Each end of the spring clip may include a hole for a screw 90 or other fastener. In this embodiment, each end of the spring clip may include front font and back restraints 16 and side restraints 18 that limit screwdriver movement, reducing the possibility that a screwdriver used to attach screw 90 will slip off of the end of the spring clip during assembly. If spring clip 10 is formed from a sheet of material, restraints 16 and 18 may be formed from folded portions of the sheet. Note that the restraints may form a solid box (lacking a top portion) around the hole for the screw in some embodiments (e.g., if the spring clip is a molded component).

FIG. 4 shows a top view of one embodiment of stiffening plate 60. Two cut-out portions 66 are shown. These cut-out portions may be configured to be located beneath the integrated circuit 200 (e.g., to allow room for components such as capacitors on the backside of the printed circuit board). As mentioned above, stiffening plate 60 may include several ridges 64 (in the illustrated embodiment, three ridges 64A–64C are shown) that increase the strength of the stiffening plate, making it less likely that the force exerted by the spring clip will deform the stiffening plate. In order to retain more of the strengthening effect of ridge 64B, the cut-out portions 66 have been arranged so that the middle portion of ridge 64B (oriented in the same direction as the ridge) is not cut-out. If ridges 64 are hollow ridges that extend away from the printed circuit board, the remaining portion of ridge 64B may be the portion of the ridge that is farthest from the printed circuit board.

Figure 5:
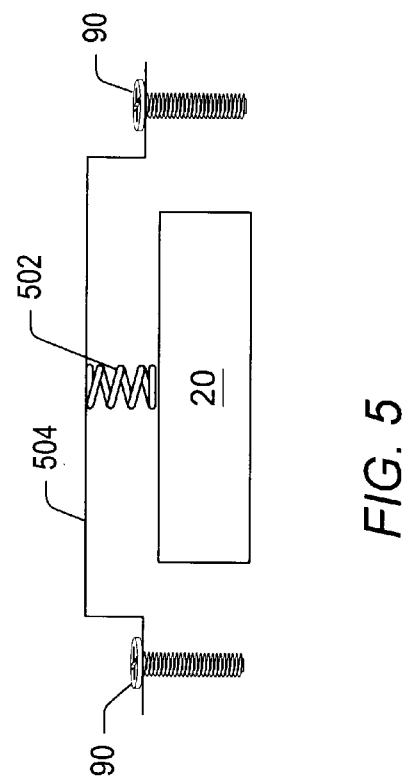
FIG. 5 shows another embodiment of a heat sink subassembly.

Note that while the above embodiments have used one or more spring clips as the force-generating device(s) that couple the heat sink to the retainer and, ultimately, to the integrated circuit to be cooled, other force-generating devices may be used in other embodiments. For example, as shown in FIG. 5, a spring 502 and a bar 504 may be used in place of a spring clip. In one embodiment, spring 502 and bar 504 may both be located on top of a shorter fin 22 within the midsection of the heat sink 20 (e.g., similarly to the embodiment shown in FIG. 1A). In some embodiments, bar 504 may include tangs similar to those shown in FIG. 1A that allow the bar 504 be coupled to the retainer (not shown) by snapping the ends of the bar onto projections in the retainer. The bar may compress the spring 502 when the bar is coupled to the retainer, causing the spring to exert a force on the heat sink 20 that keeps the heat sink in place in the retainer. Accordingly, bar 504 and spring 502 may be included in an integrated heat sink subassembly.

Figure 6:
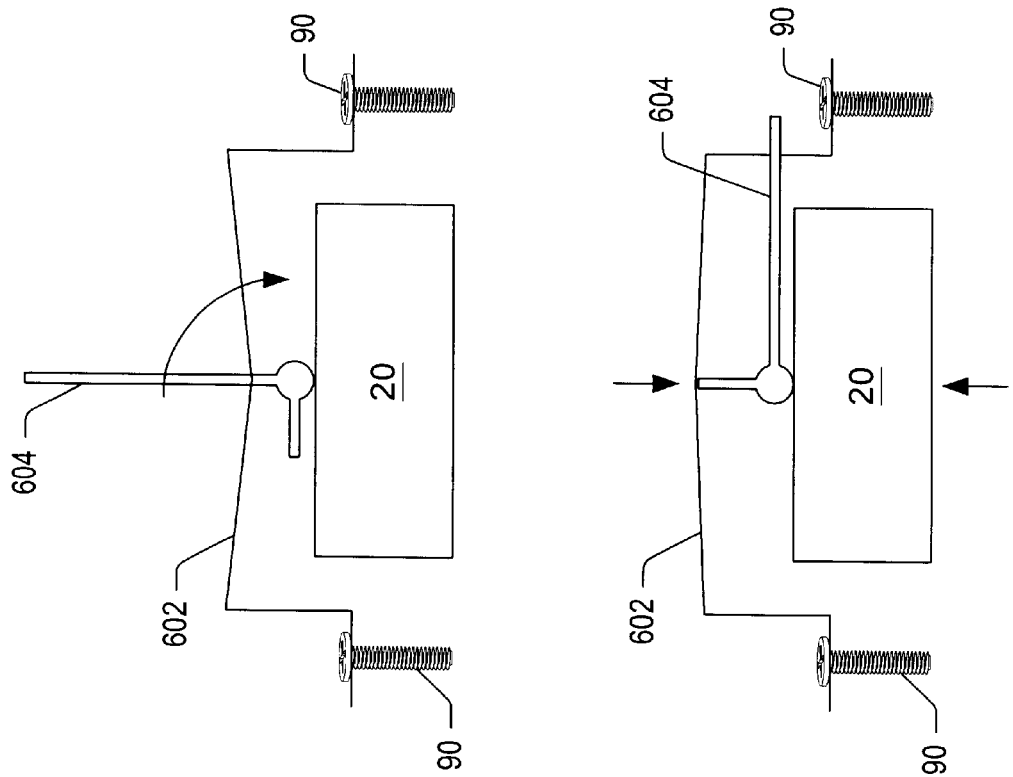
FIG. 6 shows yet another embodiment of a heat sink subassembly.

FIG. 6 shows another alternative embodiment in which a force-generating device other than a spring clip may be used., In this embodiment, a cam-actuated device, 604 may be configured to deflect a bar 602 (e.g., in response to being pulled in the direction of the arrow shown in FIG. 6). When deflected, the bar may exert a force on the heat sink 20. The bar 602 and the cam-actuated device 604 may be located on top of a shorter fin 22 within the midsection of the heat sink 20. The bar 602 and cam-actuated device 604 may both be configured to be included in an integrated heat sink subassembly as described above. Both devices 602 and 604 may be coupled to a retainer in some embodiments. In other embodiments, the bar 602 may be coupled to the retainer (e.g., by snapping tangs onto attachment points included on the retainer). A force exerted by the bar 602 when deflected may keep cam-actuated device 604 in place within the integrated heat sink subassembly.

In other alternative embodiments, more than one force-generating device may be included in a heat sink subassembly. For example, FIGS. 7A–7C show top, side, and front views of an embodiment of a computer system in which an integrated heat sink subassembly includes two leaf springs 10A and 10B. Leaf springs 10A and 10B may be located at opposite ends of heat sink 20 (portions of heat sink 20 extend underneath leaf springs 10A and 10B). The heat sink 20 may be held in a retainer 30 (most of which is not shown in this view) similar to the retainer described above. A fan 80 may be coupled to the top of the heat sink 20, as shown in FIGS. 7B and 7C. The heat sink subassembly may be coupled to a printed circuit board 204 using fasteners (e.g., a screw) 90A and 90B that each extend through one of the leaf springs, the heat sink 20, the retainer 30, and the printed circuit board 204. Using the fasteners may deflect the leaf springs, causing them to exert a force on the heat sink 20 that keeps the heat sink positioned against an integrated circuit 200.

When the heat sink subassembly is installed in a computer system, retainer 30 may be mounted between the heat sink 20 and the printed circuit board 204. Each of the fasteners 90 may be coupled to a receptacle (e.g., a nut) included in a standoff 3A or 3B mounted in the computer chassis 1. The retainer 30 may stabilize the heat sink and provide a mounting surface for the leaf springs 10A and 10B. Note that, as in the above embodiments, the heat sink subassembly may be coupled to the printed circuit board using two fasteners. Accordingly, the printed circuit board may include two holes (e.g., into or through which the fasteners, receptacles, and/or standoffs extend) for attaching the heat sink subassembly.

The retainer 30 may include several anti-rotation posts 39 that restrict the rotational movement of each leaf spring 10A and 10B (e.g., while fasteners 90 are being used). The anti-rotation posts 39 may extend against each leaf spring in one embodiment (e.g., so that the resulting friction restricts the movement of the leaf springs). In other embodiments, the anti-rotation posts may extend into and/or through the leaf springs. In the illustrated embodiment, anti-rotation posts 39A1 and 39A2 restrict the rotational movement of leaf spring 10A and anti-rotation posts 39B1 and 39B2 restrict the rotational movement of leaf spring 10B. Fewer or additional anti-rotation posts 39 may be included per force-generating device in some embodiments.

In one embodiment, the retainer 30 may include several projections or other attachment points at which the leaf springs may be securely coupled to the retainer (e.g., one or more tangs extending downward from the middle of each leaf spring may snap onto projections extending from the retainer). Securely coupling the leaf springs to the retainer may deflect the leaf springs so that they exert a force on the heat sink, keeping the heat sink securely in place within the retainer 30. Accordingly, the heat sink subassembly may be shipped and handled as an integrated subassembly in some embodiments. Note that the force exerted by the leaf springs before fasteners 90 have been used to couple the heat sink subassembly to a printed circuit board may be less than mil, the force exerted by the leaf springs when the heat sink subassembly is installed in the computer system.

Figure 8:
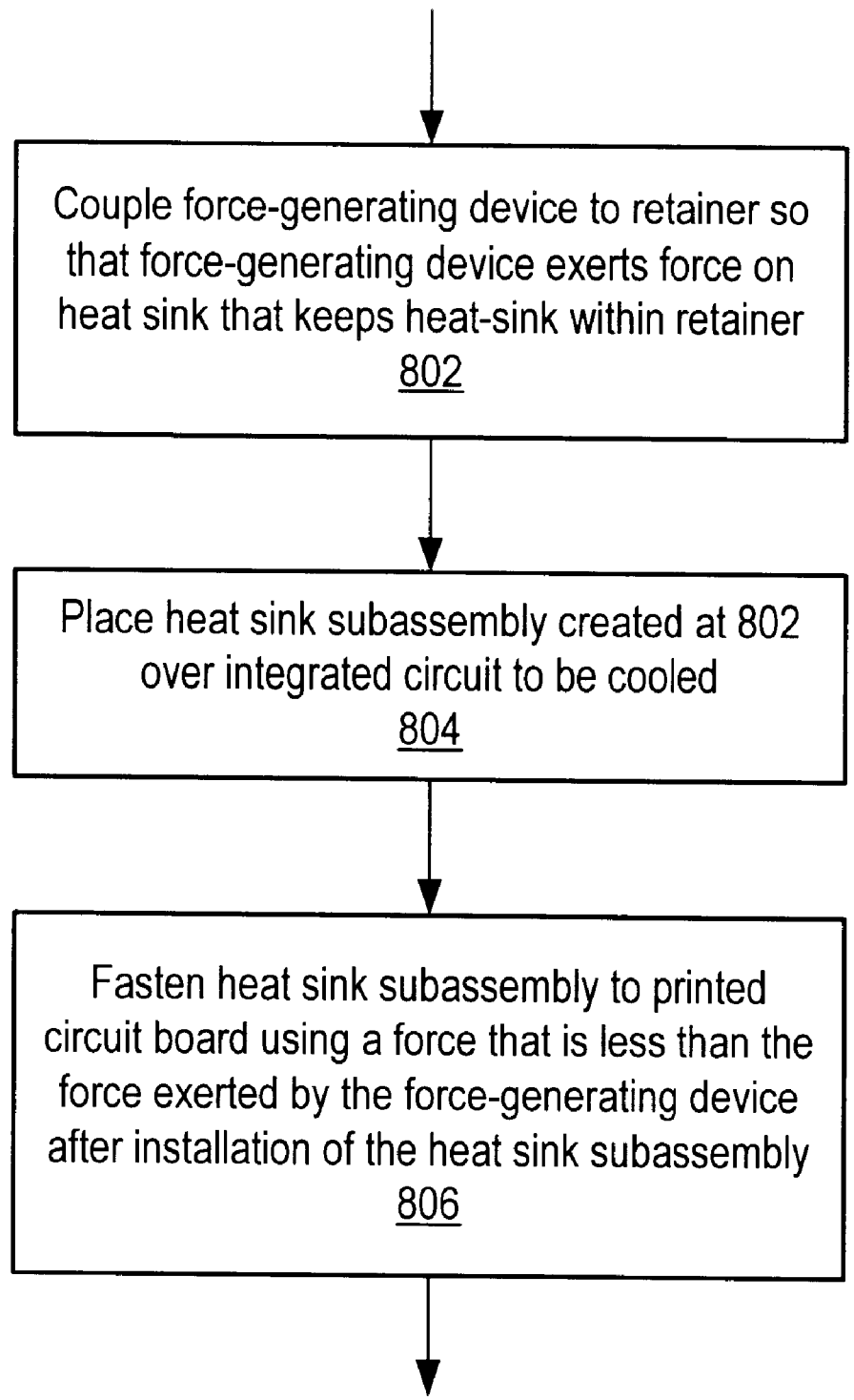
FIG. 8 is a flowchart of one embodiment of a method of assembling and installing a heat sink subassembly.

FIG. 8 shows one embodiment of a method of assembling a computer system. At 802, an integrated heat sink assembly that includes a retainer, a heat sink, and a force-generating device is formed by coupling one or more force-generating devices (e.g., spring clips, leaf springs, bars, etc.) to a retainer. Coupling the force-generating device to the retainer causes the force-generating device to exert a force on the heat sink. This force keeps the heat sink in place within the retainer, allowing the heat sink assembly to be handled and shipped as an integrated component.

At 804, the integrated heat sink assembly is placed over the integrated circuit to be cooled. The location of the heat sink assembly may be indicated by receptacles extending through a printed circuit board on which the integrated circuit is mounted in some embodiments. Once the integrated heat sink assembly is positioned, it may be coupled to the printed circuit board (and/or to a computer chassis or stiffener attached to the printed circuit board), as shown at 806. The attachment force required to attach the integrated heat sink assembly to the printed circuit board (e.g., to fasten screws through the force-generating device) may be significantly less than the force exerted by the force-generating device after attachment. Attaching the integrated heat sink assembly may deflect, compress, or otherwise deform the force-generating device, increasing the force exerted on the heat sink by the force-generating device. This increased force may bring the heat sink into secure contact with the integrated circuit and prevent the heat sink from separating from and/or damaging the integrated circuit if any shocks occur. By requiring a reduced attachment force, the strain on assembly workers and the risk of component damage due to a misapplied force may be reduced.

Numerous variations and modifications will become apparent to those skilled in the art once the above disclosure is fully appreciated. It is intended that the following claims be interpreted to embrace all such variations and modifications.

What is claimed is:

1. A heat sink subassembly comprising:

a retainer comprising a plurality of attachment points;

a heat sink coupled to the retainer, wherein the heat sink comprises a plurality of fins, wherein a first fin of the plurality of fins is shorter than other fins in the plurality of fins, and wherein the first fin is located between two or more of the other fins in the plurality of fins;

a force-generating device coupled to at least one of the plurality of attachment points and to the first fin, wherein when the force-generating device is coupled to the at least one of the plurality of attachment points, the force-generating device is configured to exert a force on the heat sink such that the heat sink is securely coupled to the retainer.

2. The heat sink subassembly of claim 1, further comprising an electromagnetic shield coupled to the retainer.

3. The heat sink subassembly of claim 2, wherein the electromagnetic shield is coupled to a retaining ridge extending along an inside surface of the retainer.

4. The heat sink subassembly of claim 3, wherein the electromagnetic shield is configured to be inserted and removed from the retainer without decoupling the heat sink from the retainer.

5. The heat sink subassembly of claim 2, wherein the electromagnetic shield includes one or more projections configured to limit how far the electromagnetic shield is inserted within the retainer.

6. The heat sink subassembly of claim 2, wherein the electromagnetic shield comprises a plurality of conductive extensions.

7. The heat sink subassembly of claim 6, wherein the conductive extensions are flexible.

8. The heat sink subassembly of claim 2, wherein the electromagnetic shield is electrically connected to the heat sink.

9. The heat sink subassembly of.claim 1, wherein the retainer comprises one or more sets of crush ribs, wherein each set of crush ribs is configured to retain a screw.

10. The heat sink subassembly of claim 1, wherein the retainer includes plastic.

11. The heat sink subassembly of claim 1, further comprising a fan coupled to an upper surface of the heat sink.

12. The heat sink subassembly of claim 1, wherein the force-generating device includes a spring clip.

13. The heat sink subassembly of claim 12, wherein the spring clip is a constant force spring clip.

14. The heat sink subassembly of claim 13, wherein the spring clip includes two flanges, wherein each flange includes a top edge and a bottom edge, wherein in a first portion of each flange, the top edge and bottom edge are substantially parallel, in a second portion of each flange, the bottom edge curves toward the top edge, and in a third portion of each flange, the bottom edge curves away from the top edge.

15. The heat sink subassembly of claim 1, wherein the retainer is configured to be coupled to a printed circuit board in fewer than four places.

16. The heat sink subassembly of claim 1, wherein each end of the force generating device includes a tang, wherein each tang includes a cut-out portion, wherein the cut-out portion of each tang is snapped onto a respective projection extending from the retainer, wherein the respective projection is one of the plurality of attachment points.

17. The heat sink subassembly of claim 16, wherein the cut-out portion of each tang is substantially longer than the respective projection.

18. The heat sink subassembly of claim 1, wherein the force-generating device includes a cam-actuated device.

19. The heat sink subassembly of claim 1, wherein the force-generating device includes a bar and a spring coupled between the first fin and the bar, wherein the bar is configured to compress the spring when the force-generating device is coupled to the at least one of the plurality of attachment points.

20. The heat sink subassembly of claim 1, wherein each end of the force-generating device includes a hole, wherein each end of the force-generating device includes one or more restraints configured to restrict movement of a tool used to fasten a fastener in the hole.

21. A computer system comprising:
a printed circuit board;
an integrated circuit coupled to the printed circuit board; and
a heat sink subassembly coupled to the printed circuit board, wherein the heat sink subassembly comprises:
a retainer;
a heat sink coupled to the retainer, wherein the heat sink comprises a plurality of fins, wherein a first fin of the plurality of fins is shorter than other fins in the plurality of fins, and wherein the first fin is located between two or more of the other fins in the plurality of fins; and
a force-generating device coupled to the first fin, wherein the force-generating device is configured to exert a force on the heat sink, wherein the force keeps the heat sink securely coupled to the integrated circuit.

22. The computer system of claim 21, further comprising an electromagnetic shield coupled to the retainer.

23. The computer system of claim 22, wherein the electromagnetic shield is coupled to a retaining ridge extending along an inside surface of the retainer.

24. The computer system of claim 23, wherein the electromagnetic shield is configured to be inserted and removed from the retainer without decoupling the heat sink from the retainer.

25. The computer system of claim 22, wherein the electromagnetic shield includes one or more projections configured to limit how far the electromagnetic shield is inserted within the retainer.

26. The computer system of claim 22, wherein the electromagnetic shield comprises conductive extensions configured to couple to grounding pads on the printed circuit board.

27. The computer system of claim 26, wherein the conductive extensions are flexible.

28. The computer system of claim 22, wherein the electromagnetic shield is electrically connected to the heat sink.

29. The computer system of claim 21, wherein the retainer comprises one or more sets of crush ribs, wherein each set of crush ribs is configured to retain a screw.

30. The computer system of claim 21, further comprising a stiffening plate coupled to an underside of the printed circuit board.

31. The computer system of claim 30, wherein the stiffening plate includes a plurality of ribs.

32. The computer system of claim 31, wherein a first rib of the plurality of ribs is configured to be located underneath the integrated circuit, and wherein the first rib includes one or more cut-out portions.

33. The computer system of claim 31, wherein a first rib of the plurality of ribs is configured to be located underneath the integrated circuit, and wherein the first rib includes a plurality of cut-out portions, wherein the first rib includes a ridge extending between two cut-out portions.

34. The computer system of claim 32, wherein the one or more cut-out portions are sized to expose one or more capacitors coupled to a backside of the printed circuit board.

35. The computer system of claim 30, wherein the stiffening plate comprises one or more receptacles that extend through the printed circuit board.

36. The computer system of claim 35, wherein the retainer is coupled to the stiffening plate by fasteners that extend through the retainer into the receptacles.

37. The computer system of claim 30, further comprising an insulator coupled between the stiffening plate and the printed circuit board.

38. The computer system of claim 30, wherein the stiffening plate is coupled to the printed circuit board by an adhesive.

39. The computer system of claim 21, wherein the retainer includes plastic.

40. The computer system of claim 21, further comprising a fan coupled to an upper surface of the heat sink.

41. The computer system of claim 21, wherein the force-generating device includes a spring clip.

42. The computer system of claim 41, wherein the spring clip is a constant force spring clip.

43. The computer system of claim 42, wherein the spring clip includes two flanges, wherein each flange includes a top edge and a bottom edge, wherein in a first portion of each flange, the top edge and bottom edge are substantially parallel, in a second portion of each flange, the bottom edge curves toward the top edge, and in a third portion of each flange, the bottom edge curves away from the top edge.

44. The computer system of claim 21, wherein the retainer is coupled to the printed circuit board by fasteners in fewer than four places.

45. The computer system of claim 21, wherein each end of the force generating device includes a tang, wherein each tang includes a cut-out portion, wherein the cut-out portion of each tang is snapped onto a respective projection extending from the retainer.

46. The computer system of claim 45, wherein the cut-out portion of each tang is substantially longer than the respective projection.

47. The computer system of claim 21, wherein the force-generating device includes a lever.

48. The computer system of claim 21, wherein the force-generating device includes a bar and a spring coupled between the first fin and the bar, wherein the bar is configured to compress the spring when the force-generating device is coupled to the at least one of the plurality of attachment points.

49. A computer system comprising:
   a printed circuit board comprising a plurality of holes;
   an integrated circuit coupled to the printed circuit board;
   a heat sink subassembly comprising;
      a retainer coupled to the printed circuit board by no more than two fasteners, wherein each of the fasteners extends through a respective one of the plurality of holes in the printed circuit board;
      a heat sink coupled to the retainer;
      one or more force-generating devices coupled to the heat sink, the no more than two fasteners, and the retainer, wherein the one or more force-generating devices exert a force on the heat sink, wherein the force securely couples the heat sink to the integrated circuit;
   wherein an installation force required to couple the heat sink subassembly to the printed circuit board and to cause the one or more force-generating devices to exert the force on the heat sink is less than the force exerted on the heat sink by the one or more force-generating devices.

50. The computer system of claim 49, wherein the retainer comprises one or more anti-rotation posts each configured to limit rotation of one of the one or more force-generating devices.

51. A method of assembling a computer system, the method comprising:
   attaching a force-generating device to a retainer to form a heat sink subassembly, wherein a heat sink comprising a plurality of fins is interposed between a portion of the force-generating device and a portion of the retainer, wherein said attaching causes the force-generating device to hold the heat sink in the retainer, wherein the force-generating device is coupled to a first fin of the plurality of fins, wherein the first fin is shorter than other fins in the plurality of fins;
   placing the heat sink subassembly over an integrated circuit coupled to a printed circuit board; and
   coupling the heat sink subassembly to the printed circuit board by exerting an installation force, wherein the installation force is less than a force exerted by the force-generating device on the heat sink as a result of said coupling.

52. The method of claim 51, further comprising placing a stiffening plate underneath the printed circuit board.

53. The method of claim 52, further comprising attaching the stiffening plate to the printed circuit board with an adhesive.

54. The method of claim 52, wherein said coupling comprises inserting a plurality of fasteners into a plurality of receptacles in the stiffening plate, wherein the plurality of fasteners extend through the force-generating device, the retainer, and the printed circuit board.

55. A heat sink subassembly comprising:
   a retainer comprising a plurality of attachment points;
   a heat sink coupled to the retainer, wherein the heat sink comprises a plurality of fins, wherein a first fin of the plurality of fins is shorter than other fins in the plurality of fins;
   a force-generating device coupled to at least one of the plurality of attachment points and to the first fin, wherein when the force-generating device is coupled to the at least one of the plurality of attachment points, the force-generating device is configured to exert a force on the heat sink such that the heat sink is securely coupled to the retainer; and
   an electromagnetic shield coupled to the retainer, wherein the electromagnetic shield is coupled to a retaining ridge extending along an inside surface of the retainer, and wherein the electromagnetic shield is configured to be inserted and removed from the retainer without decoupling the heat sink from the retainer.

56. A computer system comprising:
   a printed circuit board comprising a plurality of holes;
   an integrated circuit coupled to the printed circuit board;
   a heat sink subassembly comprising:
      a retainer coupled to the printed circuit board by no more than two fasteners, wherein each of the fasteners extends through a respective one of the plurality of holes in the printed circuit board;
      a heat sink coupled to the retainer;
      one or more force-generating devices coupled to the heat sink, the no more than two fasteners, and the retainer, wherein the one or more force-generating devices exert a force on the heat sink, wherein the force securely couples the heat sink to the integrated circuit;
   wherein an installation force required to couple the heat sink subassembly to the printed circuit board and to cause the one or more force-generating devices to exert the force on the heat sink is less than the force exerted on the heat sink by the one or more force-generating devices;
   wherein the retainer comprises one or more anti-rotation posts each configured to limit rotation of one of the one or more force-generating devices.

57. A method of assembling a computer system, the method comprising:

attaching a force-generating device to a retainer to form a heat sink subassembly, wherein a heat sink is interposed between a portion of the force-generating device and a portion of the retainer, wherein said attaching causes the force-generating device to hold the heat sink in the retainer;

placing the heat sink subassembly over an integrated circuit coupled to a printed circuit board; and coupling the heat sink subassembly to the printed circuit board by exerting an installation force, wherein the installation force is less than a force exerted by the force-generating device on the heat sink as a result of said coupling; and placing a stiffening plate underneath the printed circuit board.

* * * * *

UNITED STATES PATENT AND TRADEMARK OFFICE
CERTIFICATE OF CORRECTION

PATENT NO. : 6,639,800 B1
DATED : October 28, 2003
INVENTOR(S) : Eyman et al.

It is certified that error appears in the above-identified patent and that said Letters Patent is hereby corrected as shown below:

Title page,
Item [75], Inventors, please delete "James W. Delso", and insert -- James W. Deiso -- in place thereof.

Signed and Sealed this

Twenty-second Day of June, 2004

JON W. DUDAS
*Acting Director of the United States Patent and Trademark Office*